United States Patent [19]

Nishizawa et al.

[11] 3,828,230

[45] Aug. 6, 1974

[54] FIELD EFFECT SEMICONDUCTOR DEVICE HAVING AN UNSATURATED TRIODE VACUUM TUBE CHARACTERISTI

[75] Inventors: Jun-Ichi Nishizawa; Takeshi Terasaki, both of Sendai, Japan

[73] Assignee: Zaidan Hojin Hondotai Kenkyn Shinkokai, Sendai-ken, Japan

[22] Filed: July 28, 1972

[21] Appl. No.: 276,102

[30] Foreign Application Priority Data

July 31, 1972 Japan .............................. 46-57768

[52] U.S. Cl. .................................... 357/22, 357/23
[51] Int. Cl. ............................................ H01c 7/14
[58] Field of Search ................................ 317/235/21

[56] References Cited

UNITED STATES PATENTS

| | | | |
|---|---|---|---|
| 3,344,324 | 9/1967 | Beale | 317/235 |
| 3,366,802 | 1/1968 | Hilbiber | 307/251 |
| 3,578,514 | 5/1971 | Lesk | 148/175 |
| 3,667,010 | 5/1972 | Rindner et al. | 317/235 |
| 3,693,055 | 9/1972 | Beneking | 317/235 |

*Primary Examiner*—Rudolph V. Rolinec
*Assistant Examiner*—E. Wojciechowicz
*Attorney, Agent, or Firm*—Cushman, Darby & Cushman

[57] ABSTRACT

A field effect transistor comprises a semiconductor channel, a source and a drain electrode formed at the opposite ends of the channel and a gate electrode provided on the side of the channel. The channel has a small impurity density and therefore the depletion layer extending from the gate goes deep into the channel to substantially close the conductive portion of the channel even in the absence of a gate voltage. The drain current will not flow where the drain voltage is below a certain threshold voltage, and will flow where the drain volage is above the threshold voltage exhibiting a linear resistance characteristic. This drain-current to drain-voltage characteristic simulates the anode-current to anode-voltage characteristic of the triode vacuum tube very closely.

12 Claims, 13 Drawing Figures

FIELD EFFECT SEMICONDUCTOR DEVICE HAVING AN UNSATURATED TRIODE VACUUM TUBE CHARACTERISTIC

BACKGROUND OF THE INVENTION

1. Field of the Invention:

This invention relates to a field effect transistor, and more particularly to a field effect transistor having a drain-current to drain-voltage characteristic similar to the anode-current to anode-voltage characteristic of the triode vacuum tube.

2. Description of the Prior Art:

There are two types in field effect transistors (FET's), i.e., a metal-oxide-semiconductor (MOS) type and a junction-gate (JUG) type. In both cases, the current of the carriers (unipolar) flowing from the source to the drain is effectively controlled by the gate voltage. The gate voltages applied with respect to the source voltage works to control the height of the depletion layer extending from the gate into the channel, which in turn controls the height of the region through which a current is allowed to flow. In a MOS FET, the current flowing through the channel formed beneath the gate electrode and insulated from the gate electrode by an oxide layer is controlled by the electric field established in the channel by the gate voltage. This is due to the variation in the height of the depletion layer extending from the oxide-semiconductor contact. In a JUG FET, a depletion layer formed around the PN junction is varied by the gate voltage and controls the current flowing through the channel. In conventional FET's of the both types, it is arranged that the current channel is open (conductive) when no gate voltage is applied externally and the conducting channel height is varied by the applied gate voltage.

The present inventors have found that various advantages can be obtained by forming an FET in such a fashion that the depletion layers (space charged layers) extending from the gates are substantially contiguous to each other even when no gate voltage is applied. This will be first described referring to a junction type FET proposed in Japanese Pat. application No. 28405/1971 by one of the present inventors, which has triode-like characteristics (unsaturated type) unlike the conventional current saturation type characteristics, and has a reduced series (source to drain) resistance so that the product of the series resistance $r_s$ (this forms a factor for generating negative feedback) and the transconductance $G_m$ is suppressed substantially less than unity.

A typical example of the characteristic curves is shown in FIG. 1, and a schematically illustrated structure which produces the characteristics of FIG. 1 is shown in FIG. 2. Namely, when the gate voltage is absent or small, the drain current $I_D$ increases almost linearly with increasing the drain voltage $V_D$, as is illustrated by curves 1, 2, and 3. This may be called resistance modulation, since the variation in the gate voltage results in a variation in the resistance between the source and the drain i.e., $\delta V_D/\delta I_D$. When the negative gate voltage is increased in magnitude to suppress the drain current $I_D$, the drain current $I_D$ first does not begin to flow until the drain voltage $V_D$ reaches a certain value, and then above said certain value rapidly increases more than linearly with increasing drain voltage $V_D$ as is shown by curves 4, 5, and 6. The phenomenon that the drain current $I_D$ increases linearly with increasing drain voltage $V_D$ as is shown by curves 1, 2, and 3 mainly appears in the case where the depletion layers extending from the gate electrodes G and G' does not touch yet each other, whereas the phenomenon that the drain current $I_D$ do not begin to flow until the drain voltage $V_D$ reaches a certain positive value and increases rapidly with increasing drain voltage $V_D$ above said certain value mainly appears when the depletion layers extending from the gates have grown large enough by the application of a gate voltage and touch (not touch, to say exactly, but become very close) each other. In the latter case, the applied drain voltage below the certain value is found to be used for decreasing the potential barrier of the pinch-off portion made in the current path by the depletion layers.

In the above example, linear characteristics as shown by curves 1, 2, and 3 appeared when the gate voltage was small in magnitude, and characteristics very closely resembling those of a triode vacuum tube as shown by curves 4, 5, and 6 appeared when the gate voltage exceeded a certain value. Further, the value $\delta V_D/\delta V_G$, which corresponds to the amplification factor $\mu$ of the triode vacuum tube, is desired to be large for obtaining a field effect transistor of a superior efficiency. Thus, it is desired to realize the characteristics corresponding to curves 4, 5, and 6 even in the region of small gate voltage, or in other words without the accompany of the characteristics corresponding to curves 1, 2, and 3, for providing elements of superior characteristics of a good efficiency and of little distortion.

It has been found by the present inventors that the above requirement can be satisfied by forming an FET in such a manner that the depletion layers extending from the gate electrodes are substantially contiguous (very close but not integrally connected) to each other even when no gate voltage is applied.

This can be achieved by using depletion layers due to carrier diffusion-recombination across a PN junction. Namely, the extent of a depletion layers across the PN juntion is determined by the barrier potential (or contact potential) and the impurity concentration (density) in the crystal. Practically, if the resistivity of the semiconductor crystal substrate is known, an FET having such depletion layers which are formed only by the carrier diffusion-recombination and are contiguous to each other even when no gate voltage is applied can be formed by appropriately selecting the distance between the gate electrodes G and G'. In such a structure, since the depletion layers almost touch each other, the drain current $I_D$ can easily show triode-like characteristics, not showing linear increase of the drain current with increasing drain voltage, even without the application of a large negative gate voltage $V_G$. Namely, characteristics as shown in FIG. 3 are obtained with a reduction or absence of the linear region indicated by curves 1, 2, and 3 in FIG. 1. These transistors have such advantages that sufficient function can be obtained with a small gate voltage, that a large variation in the drain voltage $V_D$ can be obtained by a small variation in the gate voltage $V_G$, and that excellent action with less distortion can be performed. In addition to these advantages, capacitances between gate-and-source, and gate-and-drain are reduced and the frequency characteristics are improved.

The above description has been made on a transistor having a reduced series resistance, but it also holds for a conventional transistor having a large series resistance. A conventional FET having a large series resistance and showing pentode-like characteristics can be considered as the above-mentioned FET having a reduced series resistance and showing triode-like characteristics, itself, but now provide wih a negative feed back circuit, or, in another word, the FET operating in an emitter follower fashion. Therefore, the advantages of the present concept described above can be also applied to such kind of transistors.

Next, description will be made on the state in which the depletion layers respectively extending from the gates touch each other. As is described above, the height of the depletion layer is a function of the barrier potential at the junction or contact and the impurity concentration (density) in the crystal. Usually, the height of a depletion layer is calculated by assuming that no carriers exist in the depletion layer and that only space charges which are perfectly ionized exist in the depletion layer and solving the Poisson's equation.

For example, in a case where a plate shaped PN junction has a stepwise carrier concentration distribution, i.e. the carrier concentration on one side of the PN junction is far larger than that on the other side, so that a depletion layer grows only into the other side, the height of the depletion layer $\alpha$ is expressed by $$\alpha = R \sqrt{V/N_b}$$

where R is a factor dependent on the physical constants of the semiconductor, $N_b$ the impurity concentration (density) in the semiconductor on that side in which the depletion layer grows, and V the applied voltage including the barrier potential. Strictly speaking, it is not that there are no carriers at all in the depletion layer, nor that a clear boundary exists at the edge of the depletion layer between the perfectly ionized region and the non-ionized region. Carriers are distributed according to the Fermi-Dirac distribution even into a depletion layer. The effective extent of a depletion layer is at least three times larger than the width of the depletion layer $\alpha$ calculated as above assuming that the depletion layer is perfectly ionized. Namely, the calculated height of the depletion layer based on the perfect ionization assumption is much lower than the actual effective height. Therefore, even if such semi-conductor materials in which the calculation with the perfect ionization assumption tells that the depletion layers touch each other only by the barrier potential with a gate-to-gate distance set at 20 micrometers is employed, the actual depletion layers can touch (become very close) each other with the gate-to-gate distance set at about 60 micrometers.

SUMMARY OF THE INVENTION

An object of the invention is to provide a field effect transistor having triode vacuum-tube-like characteristics.

Another object of the invention is to provide a field effect transistor comprising a semiconductor substrate including a current channel, a source and a drain electrode, and gate electrodes sandwiching the current channel, the depletion layers extending into the channel from the gate electrodes being substantially contiguous to each other even in the absence of a gate voltage.

A further object of the invention is to provide a field effect transistor comprising a semiconductor substrate including a current channel of a low carrier concentration (density) and gate regions of a high carrier concentration, a source and a drain electrode formed on the semiconductor substrate at the both ends of the current channel, and gate electrodes formed on said gate regions.

DESCRIPTION OF THE PREFERRED EMBODIMENTS

Now, this invention will be described on the preferred embodiments referring to the accompanying drawings. Throughout the figures illustrating the embodiments of the invention, the gate voltage is set at zero unless particularly specified.

Figure 1:
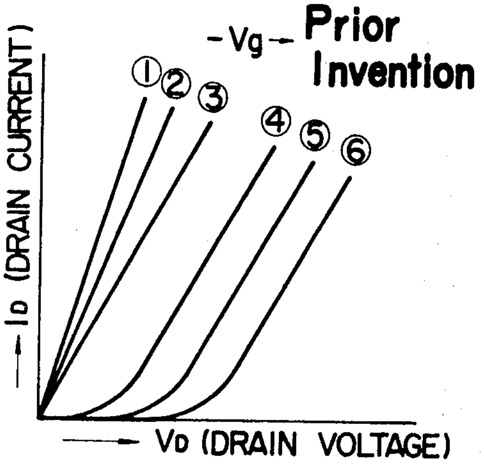
FIG. 1 is a graphical chart showing the drain-current to drain-voltage characteristics of a field effect transistor of non-saturated current type.
Figure 2:
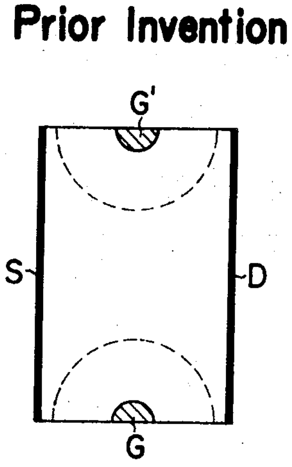
FIG. 2 is a schematic cross sectional view of a field effect transistor having the characteristics as shown in FIG. 1.
Figure 3:
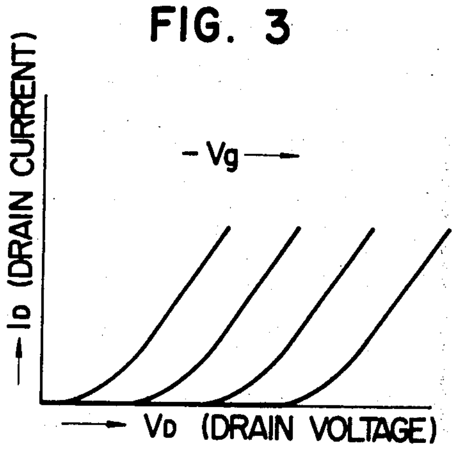
FIG. 3 is a graphical chart showing the drain-current to drain-voltage characteristics of a field effect transistor according to the present invention.
Figure 4:
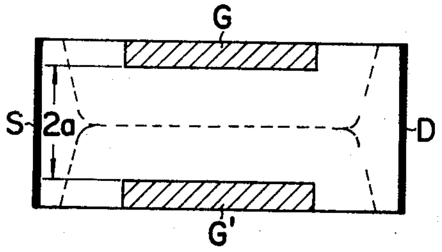
FIG. 4 is a schematic cross sectional view of a junction type field effect transistor according to this invention.

A silicon FET is shown in FIG. 4 for illustrating the height of the depletion layer. In a semiconductor substrate, gate electrode regions indicated by hatched area are formed. Provided that the impurity concentration (density) in the gate regions is far larger than that in the channel region and that the impurity concentration in the channel region is uniformly distributed, the voltage V between the channel region and the gate region when the depletion layers extending from the gate regions touch each other is expressed by the equation $$V = {}_qN_B/2\epsilon \cdot a^2$$

on the basis of the assumption of perfect ionization, where q is the electron charge, $N_B$ the impurity concentration in the channel region, $\epsilon$ the dielectric constant of the semi-conductor, and $a$ the height of the depletion layer (in this case, equal to a half of the gate-to-gate distance). When no gate voltage is applied, the voltage V is entriely formed by the contact potential (i.e., the barrier potential). Assuming that this contact potential is 0.6 volt, the maximum half distance $a$ between the gates becomes about 9, 3, and 0.9 micrometer(s) for the impurity concentrations $N_B$ of $10^{13}/cm^3$, $10^{14}/cm^3$, and $10^{15}/cm^3$ respectively. Since these values are calculated on the assumption of perfect ionization, the actual maximum distances between the gates G and G′ (two times the height of a depletion layer) become approximately 18 × 3, 6 × 3, and 1.8 × 3 micrometers for the semiconductors having an impurity concentration of $10^{13}/cm^3$, $10^{14}/cm^3$, and $10^{15}/cm^3$ respectively.

Figure 5A:
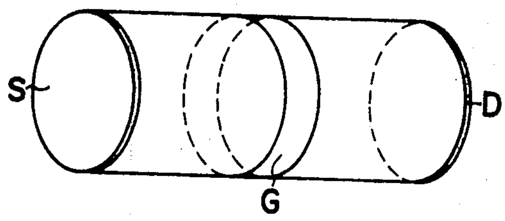
FIGS. 5A and 5B are schematic perspective and schematic cross sectional views respectively of another embodiment of a junction type field effect transistor according to the invention.
Figure 5B:
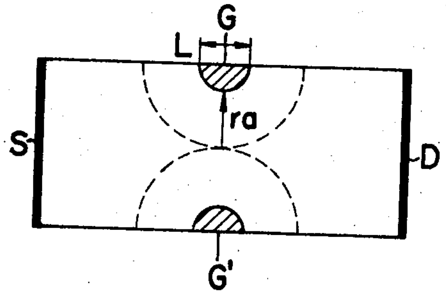

FIGS. 5A and 5B show an embodiment of a junction-gate type FET having a circular transverse cross section. An annular gate is provided in the periphery of a cylindrical semiconductor body. In this case, the voltage V when the depletion layer touches itself and closes the current path is expressed by $$V = {}_qN_B/4\epsilon \cdot r_a^2$$

on the assumption of perfect ionization, where $r_a$ is the radius of the annular gate. Actually, since the width of a depletion layer is about three times as large as the calculated value, the depletion layer becomes contiguous when the radius $r_a$ is about $\sqrt{2} \times 9 \times 3$, $\sqrt{2} \times 3 \times 3$, and $\sqrt{2} \times 0.9 \times 3$ micrometers for the impurity concentration $N_B$ of $10^{13}/cm^3$, $10^{14}/cm^3$, and $10^{15}/cm^3$, respectively.

Figure 6A:
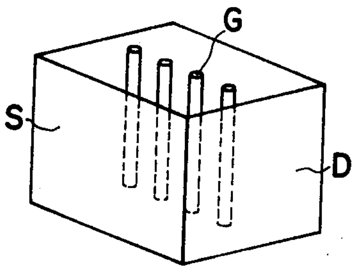
FIGS. 6A and 6B are schematic perspective and partial cross sectional views, respectively, of a further embodiment of a junction type field effect transistor according to the invention.
Figure 6B:
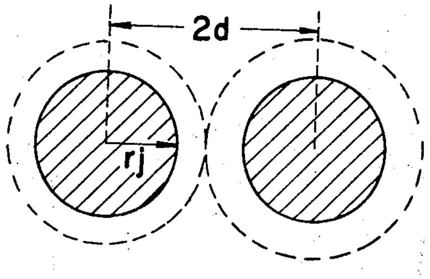

A further embodiment of a junction-gate type FET is shown in FIGS. 6A and 6B, in which a plurality of cylindrical gate regions are formed on a line with an interval of $2d$. The pinch-off voltage in this case takes a little more complicated form and is expressed as $$V = {}_qN_B/4\epsilon\ d^2\ (2\ ln\ d/r_j + r_j^2/d^2 - l),$$

where $r_j$ indicates the radius of one cylindrical gate region. At the interval about three times as large as the interval $2d$ calculated from the above equation, the depletion layers can be considered as contiguous.

For example in the embodiment of FIG. 5, the series resistance increases with increasing longitudinal length L of the gate electrode and decreases with decreasing length L. Thus, an FET of a large output power can be formed by connecting a large number of such channels.

Figure 7:
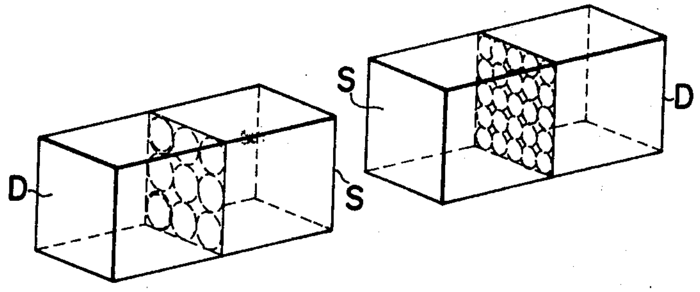
FIGS. 7 and 8 illustrate further embodiments of junction type field effect transistors of high output power according to the invention.

FIG. 7 shows an embodiment of a large output FET along the above line.

Figure 8:
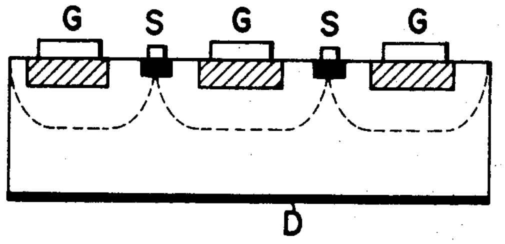

Alternatively, a large output FET having a planar structure as shown in FIG. 8 may be formed. In this case, the distance $2a$ between the adjacent gates is also arranged considering the impurity concentration so that the current channel is interrupted by the contiguous depletion layers. The gates and the sources are respectively connected in parallel for a large power transistor.

Various alternations and modifications are possible within the spirit and scope of the present invention.

If the impurity concentration in the channel region is not uniform due to the employment of a diffusion process, etc., the calculation of the height of a depletion layer becomes complicated, but a value three times as large as the calculated value on the basis of the perfect ionization assumption also holds for the actual situation.

The present invention is not limited to junction-gate type FET's, but is also applicable to MOS FET's. The gist of the present invention lies in the depletion layers contiguous to each other. In a MOS FET, a space charge region is usually formed under an oxide film beneath the gate electrode. The dimension of the space charge region differs according to the properties of the oxide film but can be given by the Debye length which is dependent on the impurity concentration in the substrate. Thus, structures in which depletion layers touch each other even in the absence of a gate voltage can also be realized in MOS structure by utilizing the internal potential at an insulator-semi-conductor contact corresponding to the barrier potential at a junction.

Figure 9:
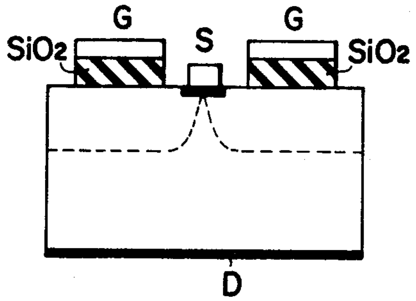
FIGS. 9 to 11 are cross sectional views of embodiments of MOS type field effect transistors according to the invention.
Figure 10:
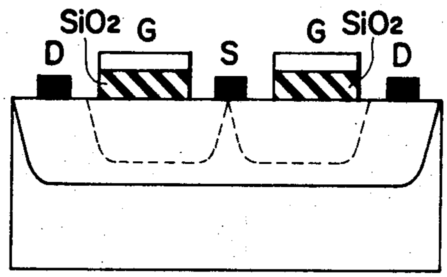
Figure 11:
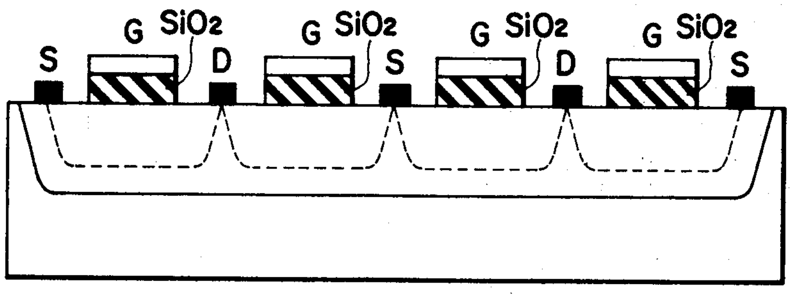

FIGS. 9, 10, and 11 show embodiments of MOS FET's according to the invention. In FIG. 9 a source and a drain electrode is formed on the opposite surfaces and a gate electrode is formed around the source to effectively extend the depletion layer. The radius of the gate electrode is selected less than the Debye length so that the current channel from the source electrode is closed by the depletion layer even in the absence of a gate voltage. FIG. 10 shows an embodiment in which an electrically isolated region is formed in one surface of a semiconductor substrate, and a source, an annular gate and an annular drain electrode are formed on said region.

FIG. 11 shows another embodiment which is intended to provide a high output power by alternatively forming source and drain electrodes respectively connected in parallel.

In the above embodiments, the shape of the source and/or drain and/or gate electrode may be rectangular or comb form. The gate electrodes are insulated from the semi-conductor substrate by an insulator film such as an $SiO_2$ film.

The present invention is applied to silicon elements in the above embodiments but is also applicable to other semiconductor materials such as GaAs. Further, with the use of a hetero junction, a space charged region not only due to the carrier concentration but also due to the difference in the band structures can be utilized.

The present invention is described on various structures, but is most effective to those having a reduced series resistance to have a small output resistance. If such elements are assembled in an integrated circuit, there can be provided superior switching characteristics which are made more effective by the smallness of the accompanying capacitances.

When the gate-to-gate distance is further reduced, the standing-up point of the drain current shifts to higher drain voltage side and suitable circuit designs based on the thus obtained characteristics are possible. Therefore, this invention gives the upper limit for the gate-to-gate distance.

We claim:

1. A field effect semiconductor device capable of exhibiting unsaturable drain voltage versus drain current characteristics comprising:

a first and second spaced gate region formed of a relatively high impurity doped semiconductor material and having a first conductivity type;

a semiconductor region located adjacent to said first and second spaced regions and having an opposite conductivity type, said second region being formed of a substantially intrinsic semiconductor material of a low carrier concentration, said semiconductor region having a portion forming a current channel between said first and second gate regions, said channel including the semiconductor region disposed between respective junctions formed with said first and second gate regions defining the sides of said channels and including a depletion layer incident to each of said junctions, said depletion layers being contiguous or overlapping each other to achieve a pinch-off condition within said channel in the absence of a reverse bias voltage applied to said first and second gate regions;

a source region located along said channel for supplying a current thereto;

a drain region spaced from said source region along said channel for providing an output current, said source region and drain region comprising semiconductor regions having the same conductivity type as said channel region;

gate biasing means for applying a reverse bias voltage to said first and second gate regions to increase the effective length of the overlapping depletion layers along said current channel with an increase in magnitude of the applied reverse bias voltage to thereby determine a threshold drain voltage, wherein the application of a drain voltage greater than said threshold voltage allows the carriers from the source region to travel toward said drain region in the depletion layer existing along the current channel in the same manner as that exhibited by a triode vacuum tube.

2. The field effect semiconductor device of claim 1, in which the extent of the depth of said depletion layers is determined by the contact potential at said junction and by the impurity concentration of the semiconductor material of the channel region, wherein the gate-to-gate distance is determined.

3. The field effect semiconductor device of claim 1, in which the output current at said drain region exhibits an unsaturated non-linear characteristic with respect to the applied drain voltage when said drain voltage is above a threshold determined by a given gate bias voltage.

4. The field effect semiconductor device of claim 1, in which said channel constituting the semiconductor region is formed of a plate elongated in the source-to-drain direction, and said first and second gate regions are formed on the two principal surfaces of said plate sandwiching therebetween said current channel, the depletion layers extending from said gates and contacting or overlapping each other.

5. The field effect semiconductor device of claim 4, in which each of said gate electrodes has a dimension in the longitudinal direction along said current channel small enough to reduce the series resistance of the channel.

6. The field effect semiconductor device of claim 1, in which said source and drain regions and said gate regions are disposed on one surface of the semiconductor material constituting the current channel.

7. The field effect semiconductor device of claim 1, in which said channel constituting semiconductor material is silicon having an impurity concentration below the order of $10^{15}/cm^3$.

8. The field effect semiconductor device of claim 4, in which said current channel between the gate regions has a diametrical dimension of at most three times the total width of the total depletion layers calculated from the assumption of perfect ionization in the depletion layers.

9. A field effect transistor accoridng to claim 1, wherein said semiconductor substrate is cylindrical and the gate electrode has a hollow cylindrical shape formed on the side surface of said cylindrical substrate surrounding the current channel extending therewithin.

10. A field effect transistor according to claim 1, wherein said gate electrode is annular and surrounds the source electrode.

11. A field effect transistor according to claim 1, wherein said semiconductor substrate is cylindrical and said gate electrode is formed on an intermediate portion of the side surface of said cylinder.

12. A field effect transistor according to claim 1, wherein a plurality of said gate regions are formed in and traversing the current channel.

* * * * *

UNITED STATES PATENT OFFICE
CERTIFICATE OF CORRECTION

Patent No. 3,828,230 Dated August 6, 1974

Inventor(s) Nishizawa et al.

It is certified that error appears in the above-identified patent and that said Letters Patent are hereby corrected as shown below:

In the heading change:

"[54] FIELD EFFECT SEMICONDUCTOR DEVICE HAVING AN UNSATURATED TRIODE VACUUM TUBE CHARACTERISTI"
to -- FIELD EFFECT SEMICONDUCTOR DEVICE HAVING AN UNSATURATED TRIODE VACUUM TUBE CHARACTERISTIC --

"[73] Assignee: Zaidan Hojin Hondotal Kenkyn"
to -- Assignee: Zaidan Hojin Handotai Kenkyu --

"[30] July 31, 1972"

to -- July 31, 1971 --

Signed and sealed this 26th day of November 1974.

(SEAL)
Attest:

McCOY M. GIBSON JR.
Attesting Officer

C. MARSHALL DANN
Commissioner of Patents